United States Patent
Minamio et al.

(10) Patent No.: US 6,897,428 B2
(45) Date of Patent: May 24, 2005

(54) SOLID-STATE IMAGING DEVICE AND METHOD FOR MANUFACTURING THE SAME

(75) Inventors: Masanori Minamio, Takatsuki (JP); Tetsushi Nishio, Kyoto (JP); Toshiyuki Fukuda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/877,927

(22) Filed: Jun. 25, 2004

(65) Prior Publication Data

US 2005/0001145 A1 Jan. 6, 2005

(30) Foreign Application Priority Data

Jul. 1, 2003 (JP) .......................... 2003-189775

(51) Int. Cl.[7] .............................. H04N 3/14; H04N 5/335
(52) U.S. Cl. ................... 250/208.1; 257/676; 257/693; 348/340; 438/106
(58) Field of Search .............................. 250/208.1, 239; 257/433, 676, 678, 692, 693, 734; 348/340, 373, 374; 438/106, 110–113, 123–125

(56) References Cited

U.S. PATENT DOCUMENTS 4,594,613 A * 6/1986 Shinbori et al. ............ 348/340

2004/0212717 A1 * 10/2004 Minamio et al. ........... 348/340

FOREIGN PATENT DOCUMENTS

JP 2001-77277 3/2001

* cited by examiner

*Primary Examiner*—Kevin Pyo
(74) *Attorney, Agent, or Firm*—Merchant & Gould P.C.

(57) ABSTRACT

A solid-state imaging device includes: a housing having a base and a rectangular-frame-shaped rib that are resin molded integrally; metal lead pieces embedded in the housing, each of which has an internal terminal portion facing an internal space, an external terminal portion exposed on a bottom face, and a side electrode portion exposed on an external side face; an imaging element fixed on the base; connection members connecting electrodes of the imaging element and the internal terminal portions of the metal lead pieces, respectively; and a transparent plate fixed on an upper end face of the rib. A thickness of each metal lead piece at a position of its internal terminal portion is substantially equal to a thickness of the base, and the external terminal portion is formed with a reverse face of the metal lead piece at a position corresponding to the internal terminal portion. In the resin molding, the internal terminal portion is pressed against the upper mold, whereby the occurrence of resin burrs is suppressed.

13 Claims, 8 Drawing Sheets

SOLID-STATE IMAGING DEVICE AND METHOD FOR MANUFACTURING THE SAME

FIELD OF THE INVENTION

The present invention relates to a solid-state imaging device provided with an imaging element such as a CCD mounted on a base, and to a method for manufacturing the same.

BACKGROUND OF THE INVENTION

Solid-state imaging devices are used widely for video cameras, still cameras, and the like, and are provided in a form of a package in which an imaging element such as a CCD is mounted on a base made of an insulating material and a photo-detector region is covered with a transparent plate. In order to downsize the device, the imaging element is mounted on the base while keeping a bare chip state. As a conventional example of such a solid-state imaging device, a solid-state imaging device disclosed by JP 2001-77277 A is shown in FIG. 10.

In FIG. 10, 41 denotes a housing, which is composed of a base 41a and a frame-shaped rib 41b that are formed integrally by resin molding, above which an internal space 42 is formed. In the housing 41, a die pad 43 and leads 44 are embedded so as to be positioned at the center of the base 41a and under the rib 41b, respectively. An imaging element chip 45 disposed at the center of the internal space 42 is fixed to a top face of the die pad 43. Each lead 44 includes an internal terminal portion 44a that is exposed to the internal space 42 on a top face of the base 41a surrounded by the rib 41b, and an external terminal portion 44a that is exposed on a bottom face of the base 41a under the rib 41b. The internal terminal portion 44a and a bonding pad of the imaging element chip 45 are connected via a bonding wire 46 made of a metal wire. Further, a transparent sealing glass plate 47 is fixed to a top end face of the rib 41b, whereby a package for protecting the imaging element chip 45 is formed.

This solid-state imaging device is mounted on a circuit board, with a sealing glass plate 47 side facing upward, as shown in the drawing, and the external terminal portions 44b are used for connection with electrodes on the circuit board. Though not shown, above the sealing glass plate 47, a lens barrel incorporating an imaging optical system is to be attached, with the relative positional relationship of the same with a photo-detector region formed on the imaging element chip 45 being adjusted so that a predetermined accuracy is achieved. During an imaging operation, light from an object to be imaged is focused on the photo-detector region via the imaging optical system incorporated in the lens barrel, and is subjected to photoelectric conversion.

Since a solid-state imaging device with such a structure is connected with electrodes on a circuit board via its external terminal portions 44b exposed on the bottom face of the housing, the device has a small package height and a small occupied area and is suitable for high-density packaging as compared with a structure in which connection is achieved by employing outer leads that are bent downward from side faces of a housing.

For the resin molding of the housing 41 shown in FIG. 10, an upper mold 48 and a lower mold 49 as shown in FIG. 11 are used in the technique disclosed by JP 2001-77277 A. A top face of the lower mold 49 is flat. On a bottom face of the upper mold 48, a recess 48a corresponding to the rib 41b is formed. On both sides of the recess 48a, an inner protrusion 48b for forming the internal space 42 and an outer protrusion 48c for forming external side faces of the rib 41b are provided, respectively. The leads 44 and the die pad 43, which are provided in a integrated state as a lead frame 50, are placed between the upper mold 48 and the lower mold 49.

The presence of the lead frame 50 between the upper mold 48 and the lower mold 49 causes a cavity 51 for molding the base 41a to be formed between the inner protrusion 48b of the upper mold 48 and the lower mold 49. A resin is filled therein in the foregoing state, and thereafter, the molds are opened and a molded article is taken out thereof. In the foregoing state of the molded article, the base 41a and the rib 41b composing the housing 41 has a finished shape. After the molding, from the lead frame 50, a portion thereof positioned outside the rib 41b is cut away.

In the foregoing conventional solid-state imaging device, a thickness of the internal terminal portion 44a of the lead 44 shown in FIG. 10 is approximately half a thickness of a portion thereof under the rib 41b, and a bottom face of the internal terminal portion 44a is not exposed on the bottom face of the base 41a. This shape of the lead 44 causes an inconvenience described below.

To embed the lead 44 at an appropriate position, a resin is filled, with the lead 44 being fixed between the upper and lower molds. For this purpose, the lead 44 has to be clamped between the upper mold 48 and the lower mold 49. However, as described above, the internal terminal portion 44a of the lead 44 positioned in the internal space 42 has a thickness such that the internal terminal portion 44a does not reach the bottom base of the base 41a, and hence, it is impossible to clamp the same between the upper and lower molds.

To cope with this, in the technique described in JP 2001-77277 A, each lead 44 is positioned by clamping a portion of the lead 44 on an outer side of its external terminal portion 44b between the outer protrusion 48c of the upper mold 48 and the lower mold 49. Consequently, the molding is conducted in a state in which the internal terminal portions 44a are not clamped between the upper and lower molds. Therefore, the process cannot achieve a state in which the inner protrusion 48b of the upper mold 48 is in close contact with the top faces of the internal terminal portions 44a with a sufficient pressing force. Therefore, resin burrs tend to occur along peripheries of the internal terminal portions 44a. The resin burrs thus having occurred narrow the contact areas on the internal terminal portions 44a significantly, and cause defects in the connection in some housings.

Next, a problem hindering the downsizing, which occurs in the foregoing configuration of the conventional example, is described below. As shown in FIG. 11, the outer protrusion 48c is needed on the external side of the rib 41b, in order to form the external side faces of the rib 41b using the outer protrusion 48c, whereby the outer shape of the rib 41b is completed upon completion of the resin molding. As a result, it is possible to clamp the lead 44 at the foregoing protrusion portion, while the following problem arises also.

In a housing in which the shape of the rib 41b is determined by the resin molding, an upper end face of the rib 41b as molded is required to have a sufficient width. The reason is that an area for application of an adhesive material for fixing the sealing glass plate 47 should be ensured on the upper end face. Therefore, the width of the upper end face of the rib 41b has a restricted lower limit. In other words, there is a limit on the reduction of the width of the rib 41b, which hinders the downsizing of the area for a semiconductor device. Further, in the housing where the rib 41*b* is molded, side faces of the rib need to be tapered for release from the mold, though the taper is not shown in the drawing. The taper also causes an increase in the width of the rib 41*b*.

SUMMARY OF THE INVENTION

It is an object of the present invention to provide a solid-state imaging device in which metal lead pieces are embedded in a housing by resin molding the metal lead pieces and the housing integrally and the metal lead pieces have a shape such that the occurrence of resin burrs is suppressed at peripheries of an internal terminal portion of the metal lead piece.

It also is an object of the present invention to provide a manufacturing method suitable for mass production of small-size solid-state imaging devices, in which the leads of such a shape are resin molded integrally with a housing.

A solid-state imaging device of the present invention includes: a housing having a base and a rectangular-frame-shaped rib that are resin molded integrally; a plurality of metal lead pieces embedded in the housing, each of which has an internal terminal portion facing an internal space of the housing, an external terminal portion exposed on a bottom face of the housing, and a side electrode portion exposed on an external side face of the housing; an imaging element fixed on the base in the internal space of the housing; connection members connecting electrodes of the imaging element and the internal terminal portions of the metal lead pieces, respectively; and a transparent plate fixed on an upper end face of the rib. A thickness of each metal lead piece at a position of its internal terminal portion is substantially equal to a thickness of the base, and the external terminal portion of the metal lead piece is formed with a reverse side face of the metal lead piece at a position corresponding to the internal terminal portion.

A method of the present invention for manufacturing a solid-state imaging device includes: resin molding a housing having a base and a rectangular-frame-shaped rib, with a group of metal lead pieces being embedded therein integrally, so as to form, by each of the metal lead pieces, an internal terminal portion facing an internal space of the housing, an external terminal portion exposed on a bottom face of the housing, and a side electrode portion exposed on an external side face of the housing; fixing an imaging element on the base in the internal space of the housing; connecting electrodes of the imaging element with the internal terminal portions of the metal lead pieces via connection members, respectively; and fixing a transparent plate on an upper end face of the rib. The method is characterized by including the following step.

The method uses a lead frame that includes lead parts for forming a plurality of groups of the metal lead pieces corresponding to a plurality of the solid-state imaging devices, respectively, and that is formed so that a thickness of the lead parts at each position corresponding to the internal terminal portion is substantially equal to a thickness of the base. Further, upper and lower molds used for molding the housing are configured to form at the same time a plurality of housing-equivalent parts equivalent to a plurality of the housings and to form two adjoined ribs of the adjoined housing-equivalent parts to be joined into one body.

The resin molding is carried out with the lead frame being placed so that the lead parts are arranged at a position in the molds that corresponds to the housing-equivalent parts, and so that portions of the lead parts equivalent to the internal terminal portions are interposed and clamped between the lower mold and the upper mold, whereby the internal terminal portions are exposed so as to face the internal spaces and the external terminal portions are exposed on bottom faces of the bases.

After the imaging element is fixed in the internal space of each of the housing-equivalent parts, electrodes of the imaging element are connected with the internal terminal portions via connection members, respectively, and the transparent plate is fixed on the upper end face of the rib, the housing-equivalent parts are separated from one another to obtain the solid-state imaging devices separately by cutting in a direction perpendicular to the bases so that a rib width in a plan-view is divided into halves.

DETAILED DESCRIPTION OF THE INVENTION

Figure 1:
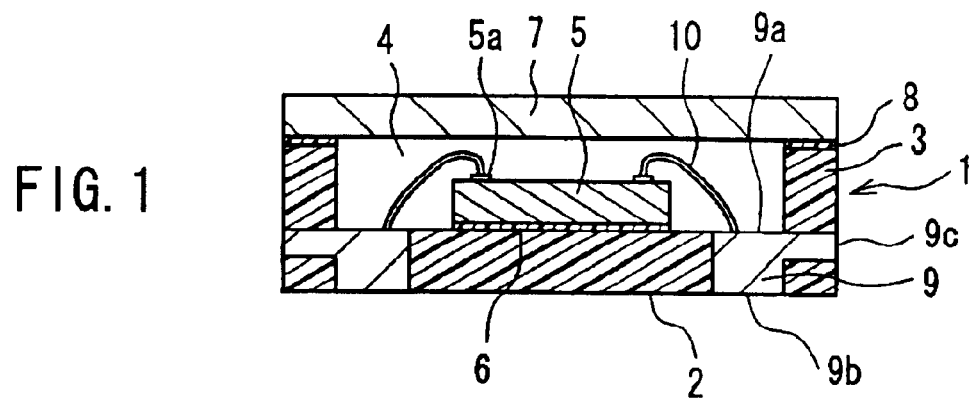
FIG. 1 is a cross-sectional view illustrating a configuration of a solid-state imaging device according to Embodiment 1 of the present invention.

The solid-state imaging device of the present invention has a shape such that each metal lead piece embedded in the housing that is resin molded integrally has a thickness substantially equal to that of the base at a position corresponding to the internal terminal portion, and has the external terminal portion formed with the reverse side face corresponding to the internal terminal. With this configuration, in the resin molding, the internal terminal portion and the external terminal portion can be interposed and clamped between upper and lower molds. Consequently, a face of the internal terminal portion is pressed against a face of the upper mold and is brought into close contact with the same, suppressing the occurrence of resin burrs.

In the foregoing configuration of the solid-state imaging device, it is preferable that a lower face of the side electrode portion of each metal lead piece is covered with the resin of the base. This causes the metal lead pieces to be fixed stably to the housing. Further, it is preferable that the external side face of the housing forms a plane substantially perpendicular to a face of the base. Still further, it is preferable that an end face of the transparent plate and surfaces of the side electrode portions form substantially the same plane as that formed with the external side face of the housing.

The device can be configured so that a surface of the external terminal portion forms substantially the same plane as that formed with the bottom face of the base. Alternatively, it may be configured so that a surface of the external terminal portion is recessed from the bottom face of the base. Besides, it can be configured so that a surface of the side electrode portion is recessed from the external side face of the housing. It may be configured so that a surface of the external terminal portion is protruded from the bottom face of the base.

With the method of the present invention for manufacturing a solid-state imaging device, the occurrence of resin burrs in the peripheries of the internal terminal portions is suppressed for the same reason as that described above regarding the solid-state imaging device. Further, since one rib is formed integrally at a border between adjoined housing-equivalent parts and the rib is cut into halves in a rib width direction when solid-state imaging devices are separated from one another, an area of each solid-state imaging device can be reduced in size. The reason for this is described below.

In the housing where each rib is formed separately as conventionally, an upper end face of the rib needs a width sufficient for applying thereon an adhesive for fixing a transparent plate. In contrast, in the housing where two ribs are formed into one body, a sufficient width for applying an adhesive can be secured, even if a width of the integrally provided two ribs is smaller than twice the width of each rib in the housing where each rib is formed separately. Therefore, by cutting the same into halves, a rib width that has been impractical previously can be used. Further, in the housing where each rib is formed separately, it is necessary to taper a side face of the rib for release of the same out of molds. In contrast, in the housing where one rib is cut into halves in the width direction, cut surfaces are perpendicular to the base without a taper. This also makes it possible to reduce the rib width.

In the foregoing manufacturing method, the transparent plate has a size such that it extends over the plurality of the housing-equivalent parts, and in the step of separating the solid-state imaging devices from one another by cutting, the transparent plate is cut as well. Further, in fixing the transparent plate on the upper end face of the rib, an adhesive material is applied on the upper end face of the rib, and a plurality of the transparent plates are mounted separately on the housing-equivalent parts, respectively, with gaps being formed between edges of the adjacent transparent plates so that fillets are formed with the adhesive material in the gaps between the edges of the transparent plates.

Still further, in the foregoing manufacturing method, it is preferable that the resin molding of the housings is carried out with sheets for suppressing occurrence of resin burrs being interposed between the molds for the resin molding and the lead frame. Further, it also is preferable that the imaging element is fixed on the base with an insulating adhesive tape being interposed therebetween.

The following will describe embodiments of the present invention specifically, while referring to the drawings.

Embodiment 1

Figure 2:
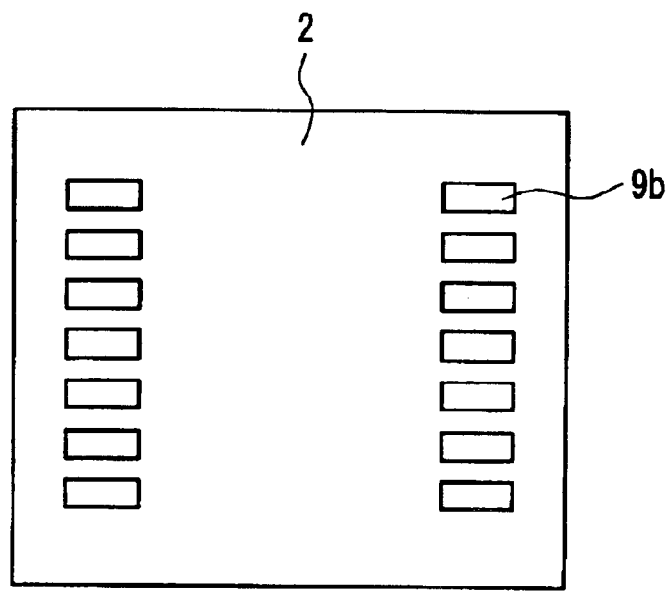
FIG. 2 is a bottom view of the solid-state imaging device shown in FIG. 1.
Figure 3:
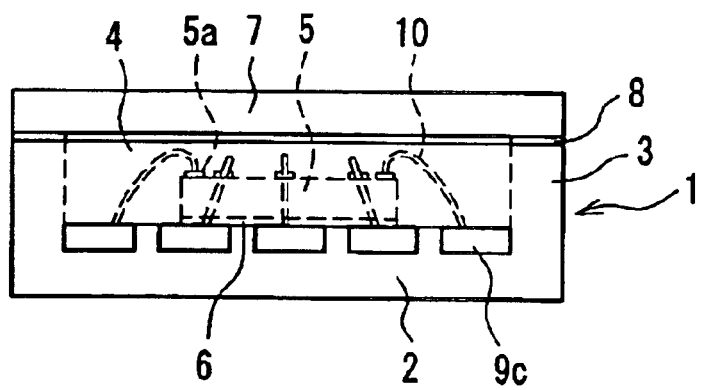
FIG. 3 is a side view of the solid-state imaging device shown in FIG. 1.

FIG. 1 is a cross-sectional view of a solid-state imaging device according to Embodiment 1, FIG. 2 is a bottom view of the same, and FIG. 3 is a side view of the same.

1 denotes a housing made of a plastic resin such as an epoxy resin, which has a structure obtained by forming a rectangular-frame-shaped rib 3 on a flat-plate-like base 2 by molding these integrally. An imaging element 5 is fixed via a bonding member 6 on a face of the base 2 that faces an internal space 4 of the housing 1. On an upper end face of the rib 3, a transparent plate 7 made of glass for instance, is fixed with an adhesive 8 interposed therebetween, whereby the internal space 4 of the housing 1 is encapsulated and a package is formed. A height of the rib 3 is set in a range of, for instance, 0.3 mm to 1.0 mm.

Figure 4:
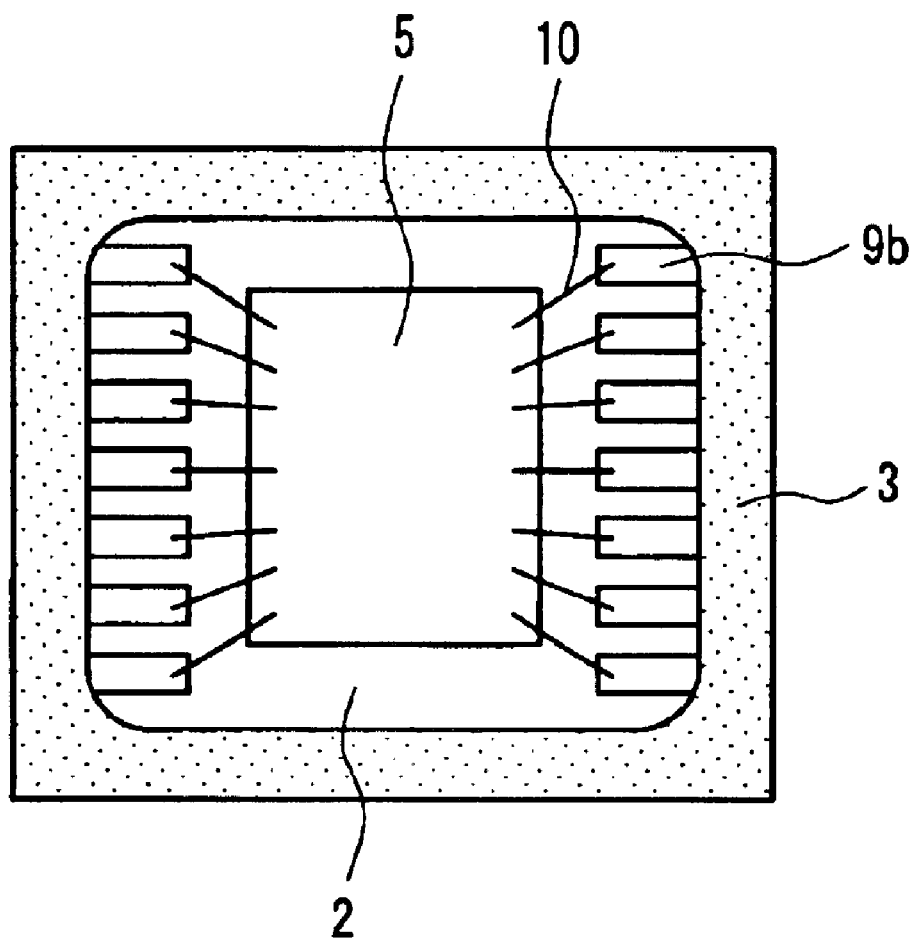
FIG. 4 is a plan view illustrating the solid-state imaging device shown in FIG. 1 in a state in which a transparent plate is removed therefrom.

In the housing 1, a plurality of metal lead pieces 9 are embedded upon molding. The metal lead pieces 9 are members for electrical leading-out from the internal space 4 of the housing 1 to the outside, each of which includes an internal terminal portion 9a exposed on a face of the base 2 on the internal space 4 side, an external terminal portion 9b exposed on a bottom face of the base 2 at a position corresponding to the internal terminal portion 9a, and a side electrode portion 9c exposed on an external side face of the housing 1. Electrodes 5a of the imaging element 5 and the internal terminal portions 9a of the metal lead pieces 9 are connected via metal thin wires 10, respectively. An overall thickness of the package is set to be, for instance, 2.0 mm or less. A plan-view shape of the solid-state imaging device shown in FIG. 1 in a state in which the transparent plate 7 is removed therefrom is shown in FIG. 4.

As shown in FIG. 1, in each metal lead piece 9, a back face thereof corresponding to the position of the internal terminal portion 9a is the external terminal portion 9b. Further, in that part, the metal lead piece 9 has substantially the same thickness as that of the base 2. Therefore, in resin molding, it is possible to clamp the internal terminal portions 9a and the external terminal portions 9b by interposing the same between upper and lower molds. This causes surfaces of the internal terminal portions 9a to be pressed against a surface of the upper mold and thereby to be in close contact therewith. Consequently it suppresses the occurrence of resin burrs. Apart of the metal lead piece 9 positioned under the rib 3 is thinned by half etching, and its bottom face is covered with a resin.

As shown in FIGS. 1 and 3, outer faces of external side walls of the housing 1, that is, outer faces of the rib 3, form planes substantially perpendicular to a surface of the base 2. End faces of the transparent plate 7 and surfaces of the side electrode portions 9c form substantially the same planes as those formed by the external side faces of the housing 1. Such a shape that the surfaces of the rib 3 and the transparent plate 7 form the same planes can be formed with excellent flatness by, for instance, cutting the rib 3 and the transparent plate 7 together in the manufacturing process.

Inner faces of the external side walls of the housing 1, that is, inner faces of the rib 3, are tapered so that the space is widened from the face of the base 2 toward the transparent plate 7. This taper, which originally is intended to facilitate the release from the molds after resin molding, can be used for substantially preventing the reflection of incident light on the inner faces of the rib 3 from adversely affecting the imaging function. Practically, planes forming inner faces of the rib 3 are inclined through an angle in a range of 2° to 12° with respect to a direction perpendicular to the face of the base 2. To reduce the influence of the reflection on the inner faces of the rib 3, the inner faces of the rib 3 may be subjected to a wire-brush finish or may be embossed.

FIG. 1 illustrates the surfaces of the external terminal portions 9b such that they form just the same plane as that formed with the bottom face of the base 2, but they may be formed so as to be recessed slightly from the bottom face of the base 2. Alternatively, the surfaces of the external terminal portions 9b may protrude of the bottom face of the base 2 slightly. Any one of these configurations may be selected appropriately according to the use or the manufacturing process. Further, the surfaces of the side electrode portions 9c may be formed so as to be recessed slightly from the external side faces of the housing 1.

Embodiment 2

A method for manufacturing a solid-state imaging device according to Embodiment 2 is described with reference to FIGS. 5A to 5f, 6 and 7. This manufacturing method is a method for manufacturing a solid-state imaging device having the configuration of Embodiment 1.

Figure 5:
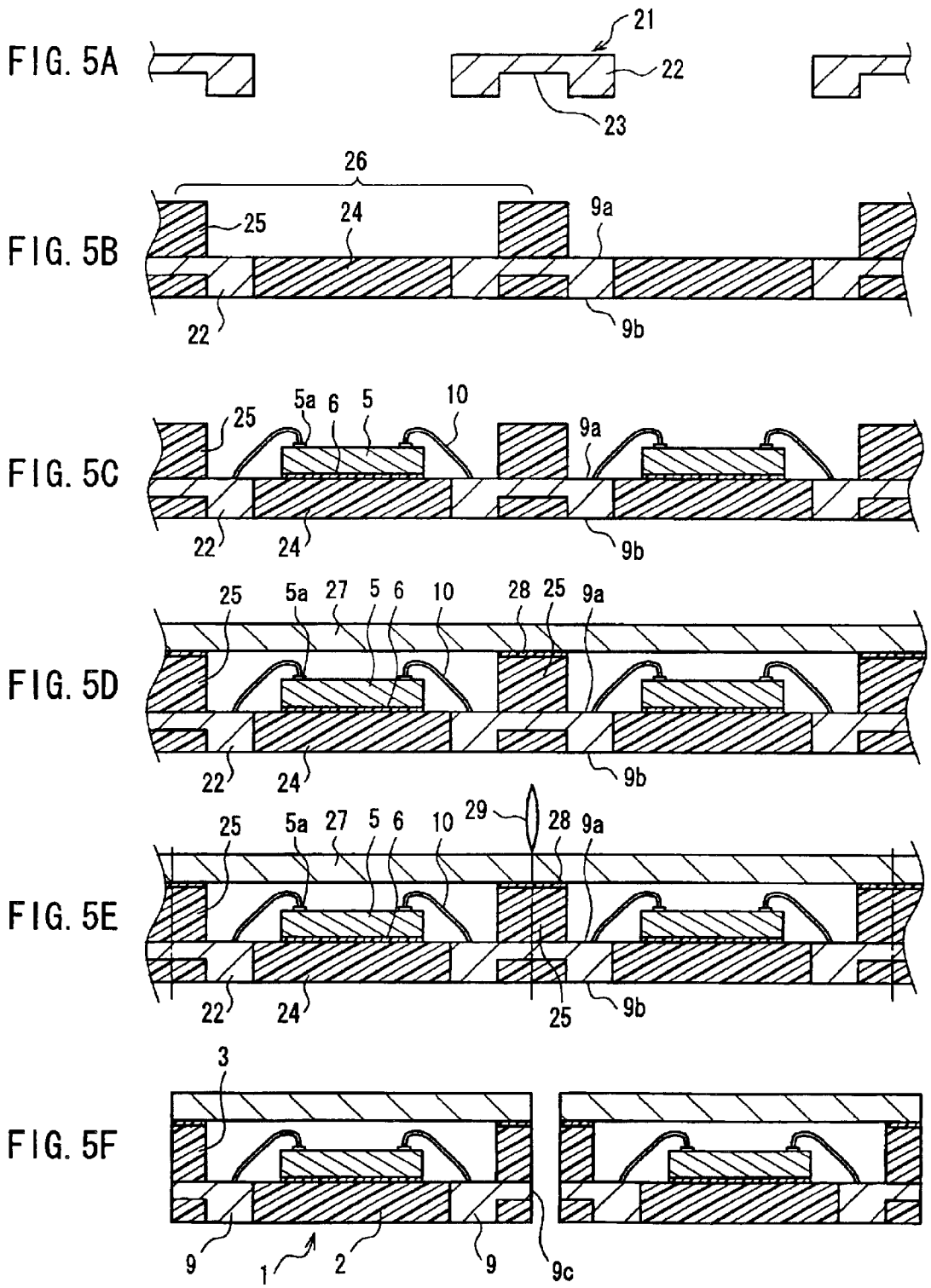
FIGS. 5A to 5F are cross-sectional views illustrating a method according to Embodiment 2 of the present invention for manufacturing a solid-state imaging device.
Figure 6:
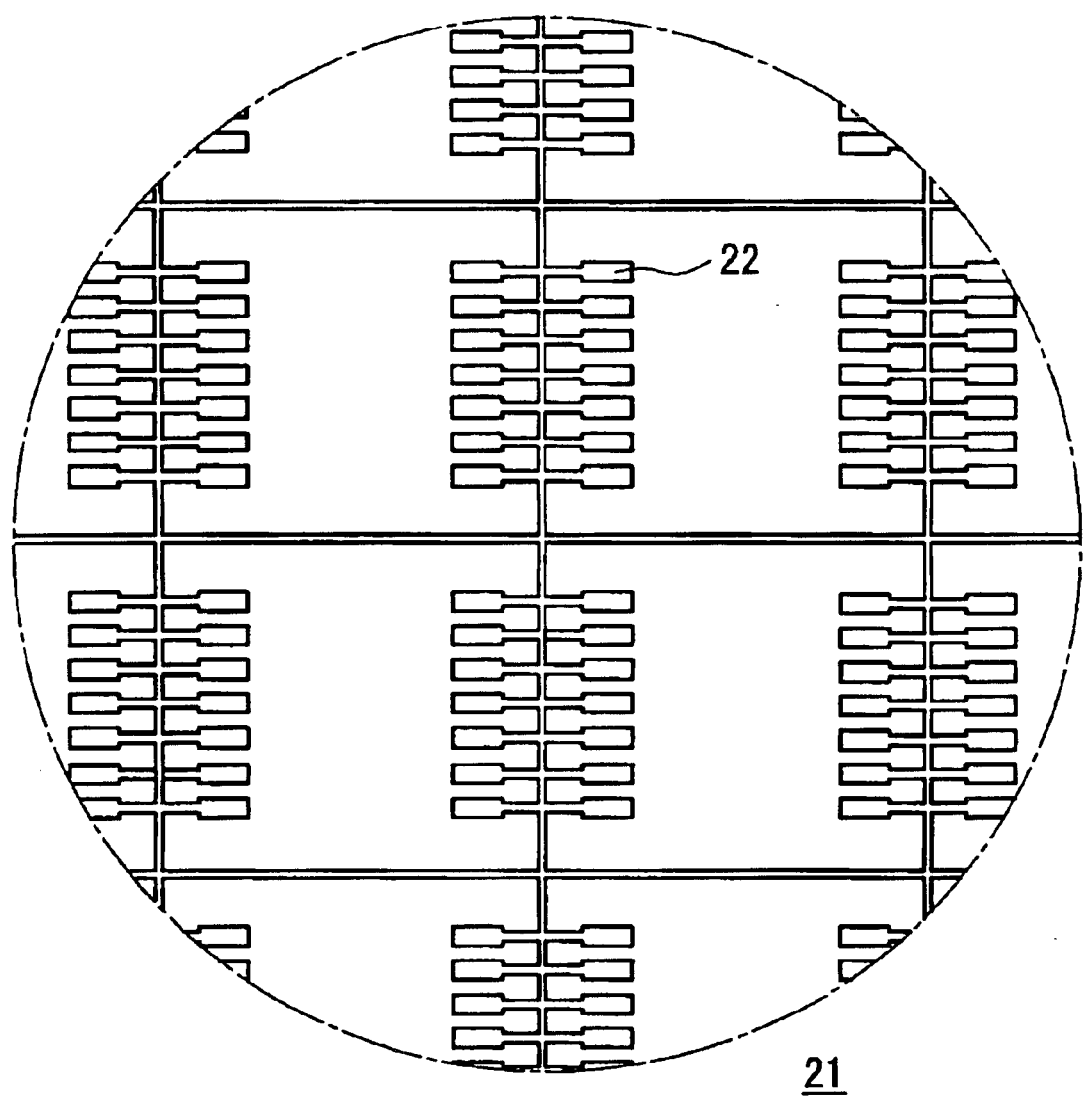
FIG. 6 is a plan view illustrating a lead frame in the foregoing manufacturing method.

As shown in FIG. 5A, first, a lead frame 21 is prepared. The lead frame 21 is obtained by connecting a plurality of lead parts 22 that are to form the metal lead pieces 9 shown in FIG. 1, as indicated by a plan-view shape of FIG. 6. A thickness of each lead part 22 at a position corresponding to the internal terminal portion 9a is adjusted so as to be substantially equal to a thickness of the base 2. The lead part 22 has, on its bottom face, a recess 23 formed by half etching, and is cut at this position in a later step, thereby forming the metal lead piece 9 as shown in FIG. 1.

Figure 7:
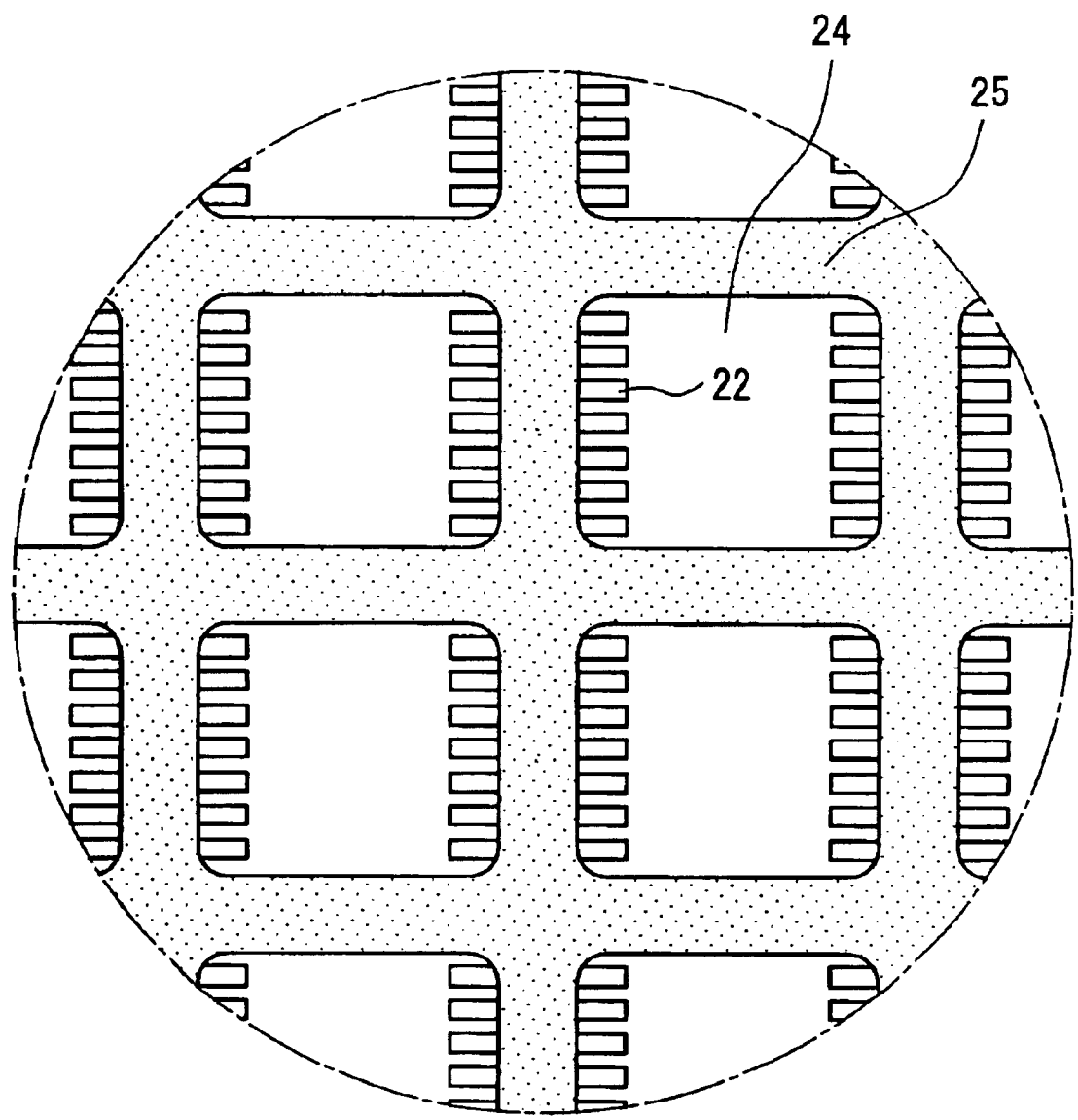
FIG. 7 is a plan view illustrating a resin molded article formed by embedding the lead frame therein in the foregoing manufacturing method.

Next, as shown in FIG. 5B, a molded article including a plurality of housing-equivalent parts 26, each of which is composed of a base 24 and a rib 25, is formed by resin molding, with the lead frame 21 being embedded therein so as to be integrally provided. FIG. 7 illustrates a plan-view shape thereof after the molding. The lead frame 21 is embedded so that top and bottom faces of each lead part 22 are exposed on top and bottom faces of each base 24 so as to form the internal terminal portion 9a and the external terminal portion 9b, respectively. The rib 25 is formed in a state in which respective ribs for adjoined housing-equivalent parts 26 are joined into one body.

Next, as shown in FIG. 5C, an imaging element 5 is fixed using an adhesive material 6 in an internal space in each of the housing-equivalent parts 26 surrounded by the rib 25, and pad electrodes 5a of the imaging element 5 and the internal terminal portions 9a are connected via metal thin wires 10.

Subsequently, as shown in FIG. 5D, an adhesive material 28 is applied over upper end faces of the rib 25, and a transparent plate 27 is mounted thereon and fixed.

Then, as shown in FIG. 5E, the transparent plate 27, the rib 25, the lead parts 22, and the bases 24 are subjected to cutting by a dicing blade 29, so as to be separated into pieces, each of which constitutes a solid-state imaging device, as shown in FIG. 5F. The cutting is carried out in directions that are perpendicular to the bases 24 and that divide the width of the rib 25 in its plan-view shape into halves as shown in FIG. 5E. Consequently, the transparent plate 27, the rib 25, the lead parts 22, and the base 24, after having been subjected to the cutting, form a transparent plate 7, a housing 1 composed of a base 2 and a rib 3, and metal lead pieces 9, which compose one solid-state imaging device. Further, side electrode portions 9c of the metal lead pieces 9 are exposed.

According to the manufacturing method of the present embodiment, one rib 25 obtained by integrally providing two adjoined ribs for adjoined housing-equivalent parts 26 is allowed to have a width smaller than twice the width in the housing where each rib 3 is formed separately. Therefore, by cutting the same into halves as shown in FIG. 5E, the width of the rib 3 in each piece of the solid-state imaging device shown in FIG. 5F becomes smaller as compared with the housing where each rib 3 is molded separately, by which the area of the solid-state imaging device is reduced.

Even if the rib 25 is configured as such, the width thereof can be secured in a range sufficient for application of an adhesive material for fixing the transparent plate 27. In an extreme example, the rib 25 may be molded so as to have the same width as the width of the rib 3 in the housing where each is molded separately, and the rib 25 thus formed may be cut into halves as shown in FIG. 5E. By so doing, the width of the rib 3 resulting from the cutting can be reduced to half the width of the conventional configuration.

Further, by cutting each rib 25 into halves in the width direction, the cut surfaces thereof are perpendicular to the base 24. In contrast, in the housing where each rib is molded separately as conventionally, external side faces of the rib should be tapered so as to be released out of a mold after molding. Therefore, the rib formed according to the present embodiment has a rib width reduced by eliminating such tapered outer portions.

Still further, since the transparent plate 27, the rib 25, and the lead part 22 are cut together by the same dicing blade 29, each package side face formed with an end face of the transparent plate 27, a side face of the housing 1, and end faces of the metal lead pieces 9 makes substantially the same plane, and excellent flatness is obtained. Therefore, upon mounting a lens barrel housing an optical system, the positioning of the optical system with respect to the photodetector region of the imaging element 5 can be performed with high accuracy, utilizing the side faces of the package as a guide. In other words, a horizontal position thereof can be determined easily by bringing inner faces of the lens barrel into contact with side faces of the package. It should be noted that the positioning in the perpendicular direction can be carried out by bringing a bottom face of the lens barrel into contact with a face of the circuit board.

Figure 8A:
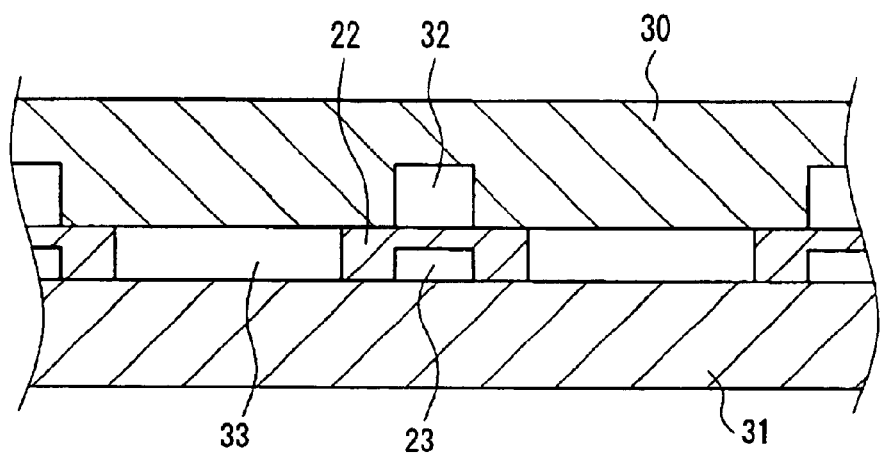
FIGS. 8A to 8C are cross-sectional views specifically illustrating a resin molding process in the foregoing manufacturing method.
Figure 8B:
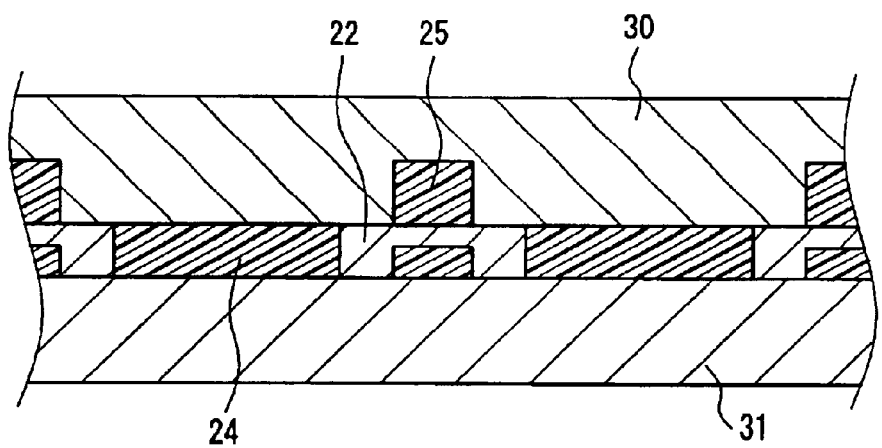
Figure 8C:
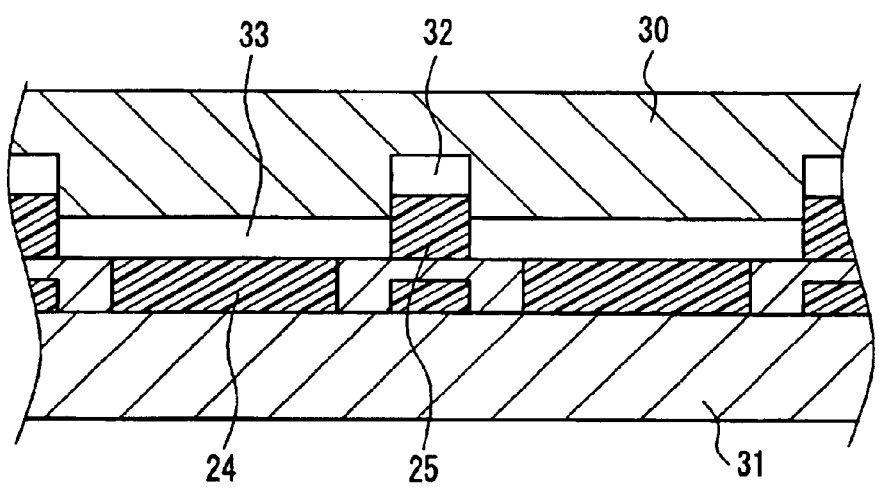

Next, the resin molding step of the housing, shown in FIG. 5B, in the above-described manufacturing process is described more specifically with reference to FIGS. 8A to 8C.

First, as shown in FIG. 8A, a lead frame is interposed between an upper mold 30 and a lower mold 31, so that upper and lower faces of the lead parts 22 are clamped between the upper mold 30 and the lower mold 31. A top face of the lower mold 31 is flat, whereas a bottom face of the upper mold 30 has recesses 32. Spaces 33 formed between the upper and lower molds 30 and 31 by interposing the lead parts 22 therebetween, spaces in the recesses 32 of the upper mold 30, and spaces in recesses 23 of the lead parts 22 form cavities for resin molding.

Then, as shown in FIG. 8B, a resin is filled in the cavities, so that the bases 24 and the rib 25 are formed. Subsequently, as shown in FIG. 8C, the molds are opened, from which a molded article in which housing-equivalent parts are provided continuously, as shown in FIG. 5B, is taken out.

The foregoing molding process enables to obtain stably a state in which faces of the molds 30, 31 and the top and bottom faces of the lead parts 22 are brought into close contact with one another by clamping the lead parts 22, at their top and bottom faces thereof, between the upper and lower molds 30 and 31. Further, peripheries of the recesses 32 of the upper mold 30 are disposed on the top faces of the lead parts 22. As a result, the occurrence of resin burrs through molding is suppressed effectively.

Further, resin sheets for suppressing the occurrence of resin burrs may be interposed between the molds and the lead frame 21 upon resin molding of housings, whereby the occurrence of burrs can be suppressed more effectively.

Embodiment 3

A method for manufacturing a solid-state imaging device according to Embodiment 3 is described with reference to FIGS. 9A to 9C. This manufacturing method is substantially identical to the manufacturing method according to Embodiment 2, except instead of a large transparent plate extending over regions of a plurality of solid-state imaging devices, transparent plates applied separately to the respective regions are employed as the transparent plates. The steps at the initial stage are identical to those shown in FIGS. 5A to 5C, and descriptions of the same are omitted herein.

Figure 9A:
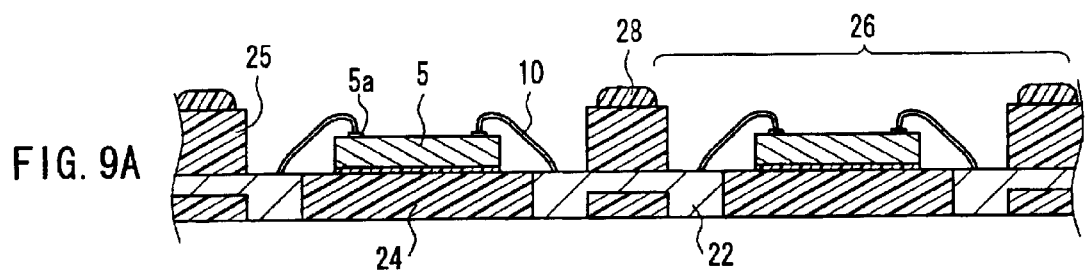
FIGS. 9A to 9C are cross-sectional views illustrating a method for manufacturing a solid-state imaging device according to Embodiment 3 of the present invention.

As shown in FIG. 9A, an imaging element 5 is fixed in an internal space of each housing-equivalent part 26 surrounded by a rib 25, and after the connection via metal thin wires 10 is finished, an adhesive material 28 is applied over upper end faces of the rib 25.

Figure 9B:
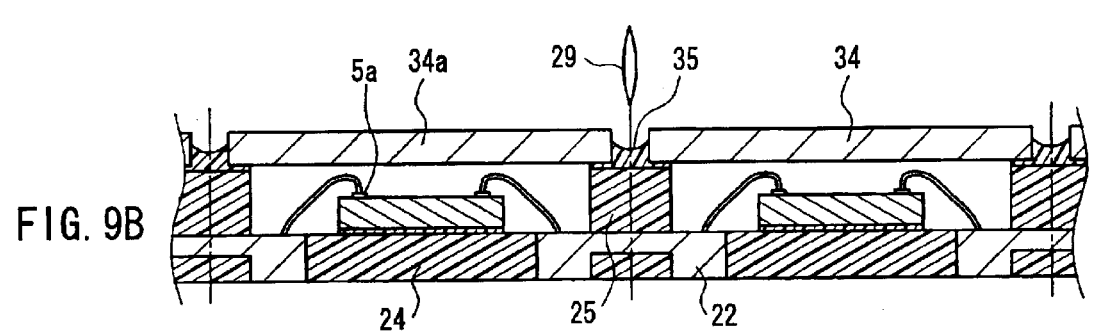

Next, as shown in FIG. 9B, transparent plates 34 formed so as to correspond to each of the housing-equivalent parts are mounted. Peripheral ends of adjacent transparent plates 34 are set in sizes such that predetermined gaps are formed therebetween on the upper end faces of the rib 25. Therefore, when the transparent plates 34 are placed on the adhesive material 28, the adhesive material 28 enters the gaps between the transparent plates 34, thereby forming fillets 35.

Figure 9C:
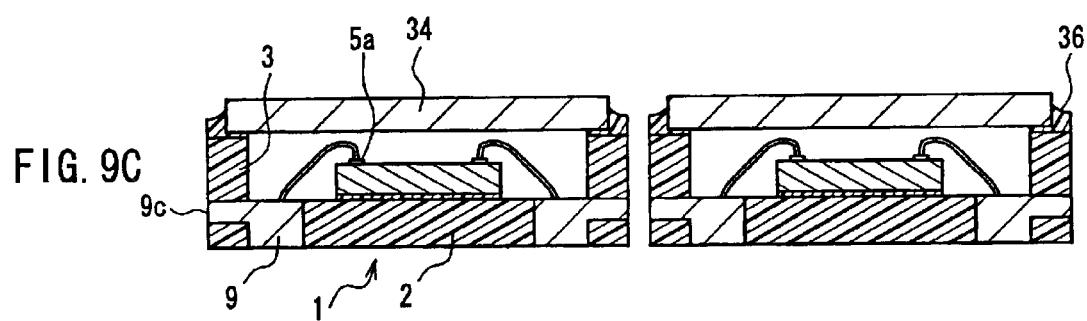
Figure 10:
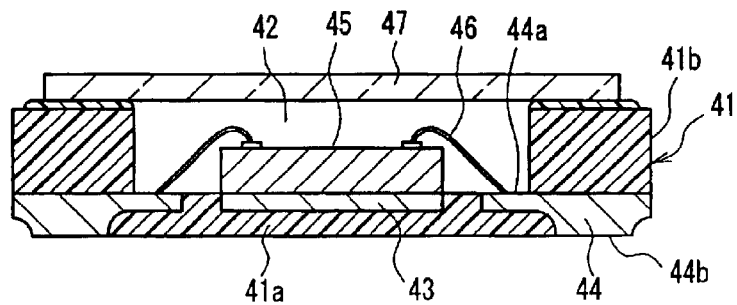
FIG. 10 is a cross-sectional view illustrating a conventional solid-state imaging device.
Figure 11:
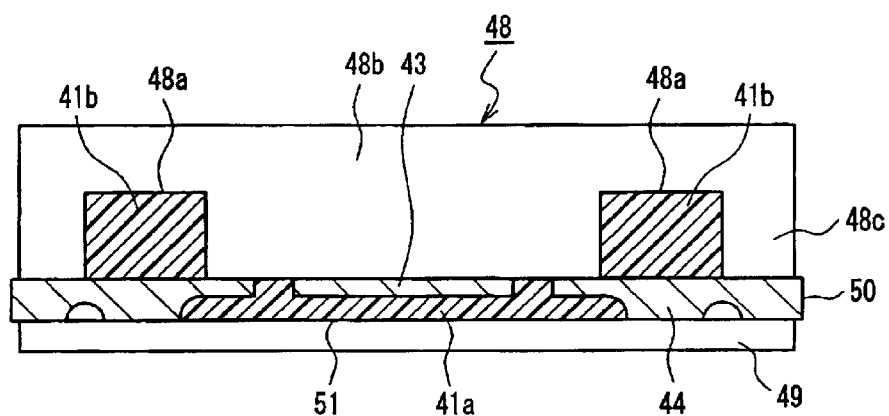
FIG. 11 is a cross-sectional view illustrating a step of molding a housing of the solid-state imaging device.

Subsequently, the fillets 35, the rib 25, the lead parts 22, and the bases 24 are subjected to cutting by a dicing blade 29, so as to be separated into pieces each of which forms a solid-state imaging device, as shown in FIG. 9C. The cutting is carried out, in the same manner as that of Embodiment 2, in directions that are perpendicular to the bases 24 and that divide the width of the rib 25 in its plan-view shape into halves. Consequently, a housing 1 composed of a base 2 and a rib 3, and metal lead pieces 9, which compose one solid-state imaging device, are formed out of the rib 25, the lead parts 22, and the base 24, which have been subjected to the cutting. Additionally, fillets 36 are left along the peripheral ends of the transparent plate 34.

The foregoing manufacturing method enables the transparent plate 34 to be fixed securely even if the rib 25 does not have a sufficiently large width, by forming the fillets 36 along the peripheral ends of the transparent plate 34.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
    a housing having a base and a rectangular-frame-shaped rib that are resin molded integrally;
    a plurality of metal lead pieces embedded in the housing, each of which has an internal terminal portion facing an internal space of the housing, an external terminal portion exposed on a bottom face of the housing, and a side electrode portion exposed on an external side face of the housing;
    an imaging element fixed on the base in the internal space of the housing;
    connection members connecting electrodes of the imaging element and the internal terminal portions of the metal lead pieces, respectively; and
    a transparent plate fixed on an upper end face of the rib, wherein a thickness of each metal lead piece at a position of its internal terminal portion is substantially equal to a thickness of the base, and the external terminal portion of the metal lead piece is formed with a reverse side face of the metal lead piece at a position corresponding to the internal terminal portion.

2. The solid-state imaging device according to claim 1, wherein a lower face of the side electrode portion of each metal lead piece is covered with the resin of the base.

3. The solid-state imaging device according to claim 1, wherein the external side face of the housing forms a plane substantially perpendicular to a face of the base.

4. The solid-state imaging device according to claim 3, wherein an end face of the transparent plate and surfaces of the side electrode portions form substantially the same plane as that formed with the external side face of the housing.

5. The solid-state imaging device according to claim 1, wherein a surface of the external terminal portion forms substantially the same plane as that formed with the bottom face of the base.

6. The solid-state imaging device according to claim 1, wherein a surface of the external terminal portion is recessed from the bottom face of the base.

7. The solid-state imaging device according to claim 1, wherein a surface of the side electrode portion is recessed from the external side face of the housing.

8. The solid-state imaging device according to claim 1, wherein a surface of the external terminal portion is protruded from the bottom face of the base.

9. A method for manufacturing a solid-state imaging device, comprising:
    resin molding a housing having a base and a rectangular-frame-shaped rib, with a group of metal lead pieces being embedded therein integrally, so as to form, by each of the metal lead pieces, an internal terminal portion facing an internal space of the housing, an external terminal portion exposed on a bottom face of the housing, and a side electrode portion exposed on an external side face of the housing;
    fixing an imaging element on the base in the internal space of the housing;
    connecting electrodes of the imaging element with the internal terminal portions of the metal lead pieces via connection members, respectively; and
    fixing a transparent plate on an upper end face of the rib, wherein
    the method uses a lead frame that includes lead parts for forming a plurality of groups of the metal lead pieces corresponding to a plurality of the solid-state imaging devices, respectively, and that is formed so that a thickness of the lead parts at each position corresponding to the internal terminal portion is substantially equal to a thickness of the base,
    upper and lower molds used for molding the housing are configured to form at the same time a plurality of housing-equivalent parts equivalent to a plurality of the housings and to form two adjoined ribs of the adjoined housing-equivalent parts to be joined into one body,
    the resin molding is carried out with the lead frame being placed so that the lead parts are arranged at a position in the molds that corresponds to the housing-equivalent parts, and so that portions of the lead parts equivalent to the internal terminal portions are interposed and clamped between the lower mold and the upper mold, whereby the internal terminal portions are exposed so as to face the internal spaces and the external terminal portions are exposed on bottom faces of the bases, and
    after the imaging element is fixed in the internal space of each of the housing-equivalent parts, electrodes of the imaging element are connected with the internal terminal portions via connection members, respectively, and the transparent plate is fixed on the upper end face of the rib, the housing-equivalent parts are separated from one another to obtain the solid-state imaging devices separately by cutting in a direction perpendicular to the bases so that a rib width in a plan-view is divided into halves.

10. The method for manufacturing a solid-state imaging device according to claim 9, wherein the transparent plate has a size such that it extends over the plurality of the housing-equivalent parts, and in the step of separating the solid-state imaging devices from one another by cutting, the transparent plate is also cut together.

11. The method for manufacturing a solid-state imaging device according to claim 9, wherein in fixing the transparent plate on the upper end face of the rib, an adhesive material is applied on the upper end face of the rib, and a plurality of the transparent plates are mounted separately on the housing-equivalent parts, respectively, with gaps being formed between edges of the adjacent transparent plates so that fillets are formed with the adhesive material in the gaps between the edges of the transparent plates.

12. The method for manufacturing a solid-state imaging device according to claim 9, wherein the resin molding of the housings is carried out with sheets for suppressing occurrence of resin burrs being interposed between the molds for the resin molding and the lead frame.

13. The method for manufacturing a solid-state imaging device according to claim 9, wherein the imaging element is fixed on the base with an insulating adhesive tape being interposed therebetween.

* * * * *